US012601798B2

(12) United States Patent
Bercovici et al.

(10) Patent No.: US 12,601,798 B2
(45) Date of Patent: Apr. 14, 2026

(54) NUCLEAR MAGNETIC RESONANCE DEVICE

(71) Applicant: 4IR Solutions Ltd., Or-Akiva (IL)

(72) Inventors: Mordechai Bercovici, Kiryat Tivon (IL); Tal Cohen, Herzliya (IL)

(73) Assignee: 4IR Solutions Ltd., Or-Akiva (IL)

( * ) Notice: Subject to any disclaimer, the term of this patent is extended or adjusted under 35 U.S.C. 154(b) by 135 days.

(21) Appl. No.: 18/629,867

(22) Filed: Apr. 8, 2024

(65) Prior Publication Data

US 2025/0314723 A1      Oct. 9, 2025

(51) Int. Cl.
G01R 33/31          (2006.01)
G01R 33/30          (2006.01)

(52) U.S. Cl.
CPC ........... G01R 33/31 (2013.01); G01R 33/307 (2013.01)

(58) Field of Classification Search
CPC .............................. G01R 33/307; G01R 33/31
See application file for complete search history.

(56) References Cited

U.S. PATENT DOCUMENTS

| | | | | |
|---|---|---|---|---|
| 5,867,026 | A * | 2/1999 | Haner | G01R 33/307 |
| | | | | 324/300 |
| 6,441,617 | B2 * | 8/2002 | Marek | G01R 33/30 |
| | | | | 324/318 |
| 10,386,530 | B2 * | 8/2019 | Song | G01R 33/345 |
| 2014/0218023 | A1 | 8/2014 | Fordham | |
| 2017/0284725 | A1 | 10/2017 | Wikus et al. | |
| 2022/0244330 | A1 | 8/2022 | Schmidig | |

FOREIGN PATENT DOCUMENTS

CN          210071709 U      2/2020

* cited by examiner

*Primary Examiner* — Gregory H Curran
(74) *Attorney, Agent, or Firm* — Reches Patents

(57) ABSTRACT

An NMR device that includes (i) a first fluid conduit that includes a measurement region and is configured to convey fluid, (ii) an NMR measurement unit that is configured to perform an NMR measurement of the fluid within the measurement region; wherein the NMR measurement unit comprises a permanent magnet; and (iii) a temperature control unit that is configured to thermally shield the permanent magnet, during the NMR measurement, from a temperature of the fluid within measurement region.

19 Claims, 8 Drawing Sheets

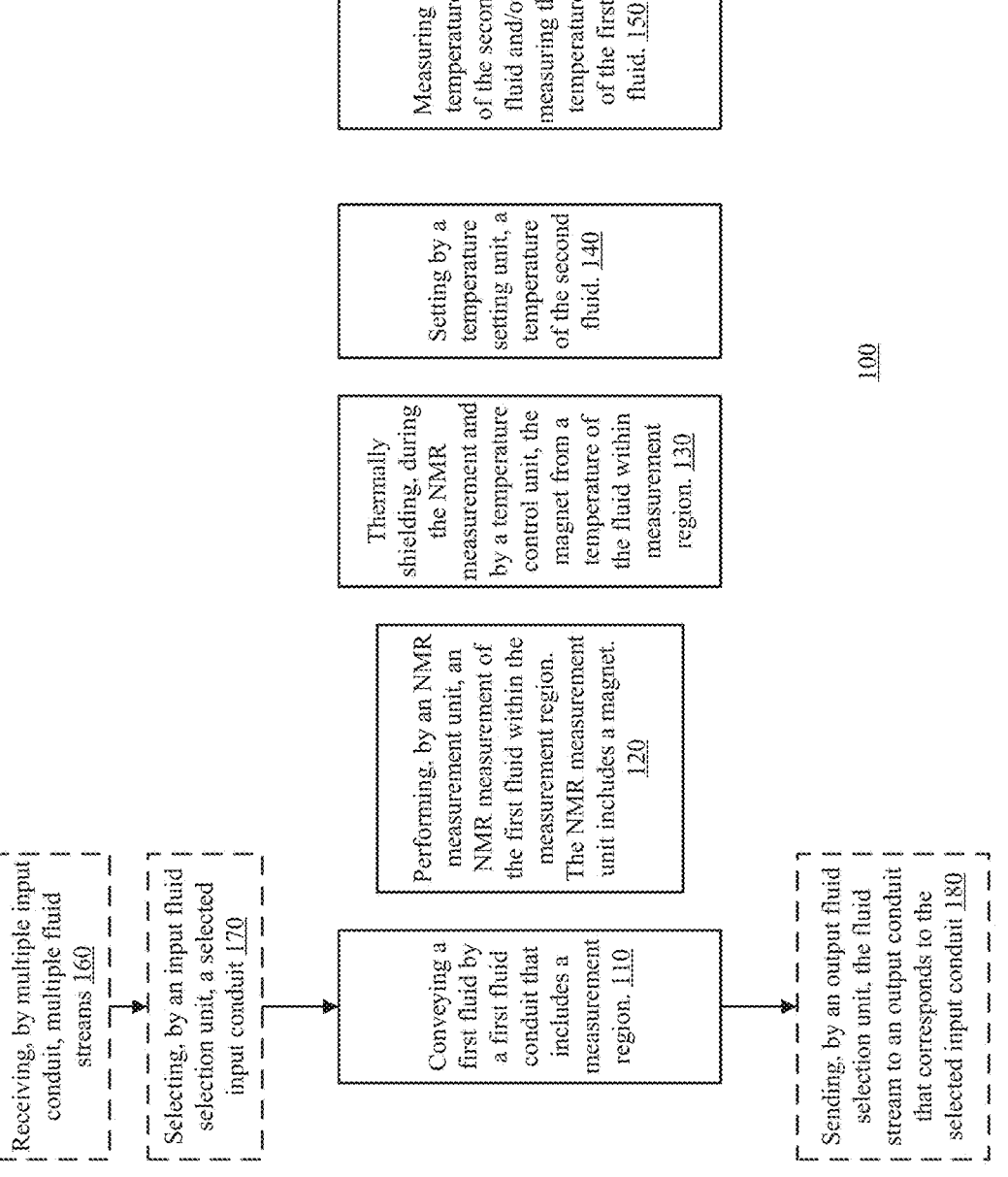

FIG. 8

Receiving, by multiple input conduit, multiple fluid streams 160

Selecting, by an input fluid selection unit, a selected input conduit 170

Conveying a first fluid by a first fluid conduit that includes a measurement region. 110

Performing, by an NMR measurement unit, an NMR measurement of the first fluid within the measurement region. The NMR measurement unit includes a magnet. 120

Thermally shielding, during the NMR measurement and by a temperature control unit, the magnet from a temperature of the fluid within measurement region. 130

Setting by a temperature setting unit, a temperature of the second fluid. 140

Measuring a temperature of the second fluid and/or measuring the temperature of the first fluid. 150

Sending, by an output fluid selection unit, the fluid stream to an output conduit that corresponds to the selected input conduit 180

100

NUCLEAR MAGNETIC RESONANCE DEVICE

BACKGROUND OF THE INVENTION

Nuclear magnetic resonance (NMR) is a physical phenomenon in which nuclei in a strong constant magnetic field are perturbed by a weak oscillating magnetic field (in the near field) and respond by producing an electromagnetic signal with a frequency characteristic of the magnetic field at the nucleus.

This process occurs near resonance, when the oscillation frequency matches the intrinsic frequency of the nuclei, which depends on the strength of the static magnetic field, the chemical environment, and the magnetic properties of the isotope involved.

NMR results from specific magnetic properties of certain atomic nuclei. Nuclear magnetic resonance spectroscopy is widely used to determine the structure of organic molecules in solution and study molecular physics and crystals as well as non-crystalline materials. See-Wikipedia.org.

A production line NMR device includes a permanent magnet that is extremely sensitive to temperature—and is limited to analyzing fluids with temperatures that do not exceed 55° C. This is in contrary to other NMR devices (such as a laboratory NMR device) that include superconductor magnets that are cooled to very low temperatures.

There is a growing need to provide an NMR device that is capable to accurately measure fluids with temperatures that well exceed 55° C.

BRIEF DESCRIPTION OF THE DRAWINGS

The subject matter that is regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawing in which:

FIG. 8 illustrates an example of a method.

DETAILED DESCRIPTION OF THE DRAWINGS

There is provided an NMR device that is capable of measuring fluids having temperatures that well exceed 55° C.

According to an embodiment, the NMR device is configured to thermally isolate the permanent magnet from the temperature of a first fluid (that is evaluated by the NMR device and flows through a first fluid conduit) and is capable of setting the temperature of the permanent magnet by using a second fluid that flows through a second fluid conduit that is located between the first fluid and the permanent magnet.

According to an embodiment, the first fluid conduit and the second fluid conduit are made of thermally isolating material-thereby assisting in the thermal isolation of the permanent magnet.

Figure 1:
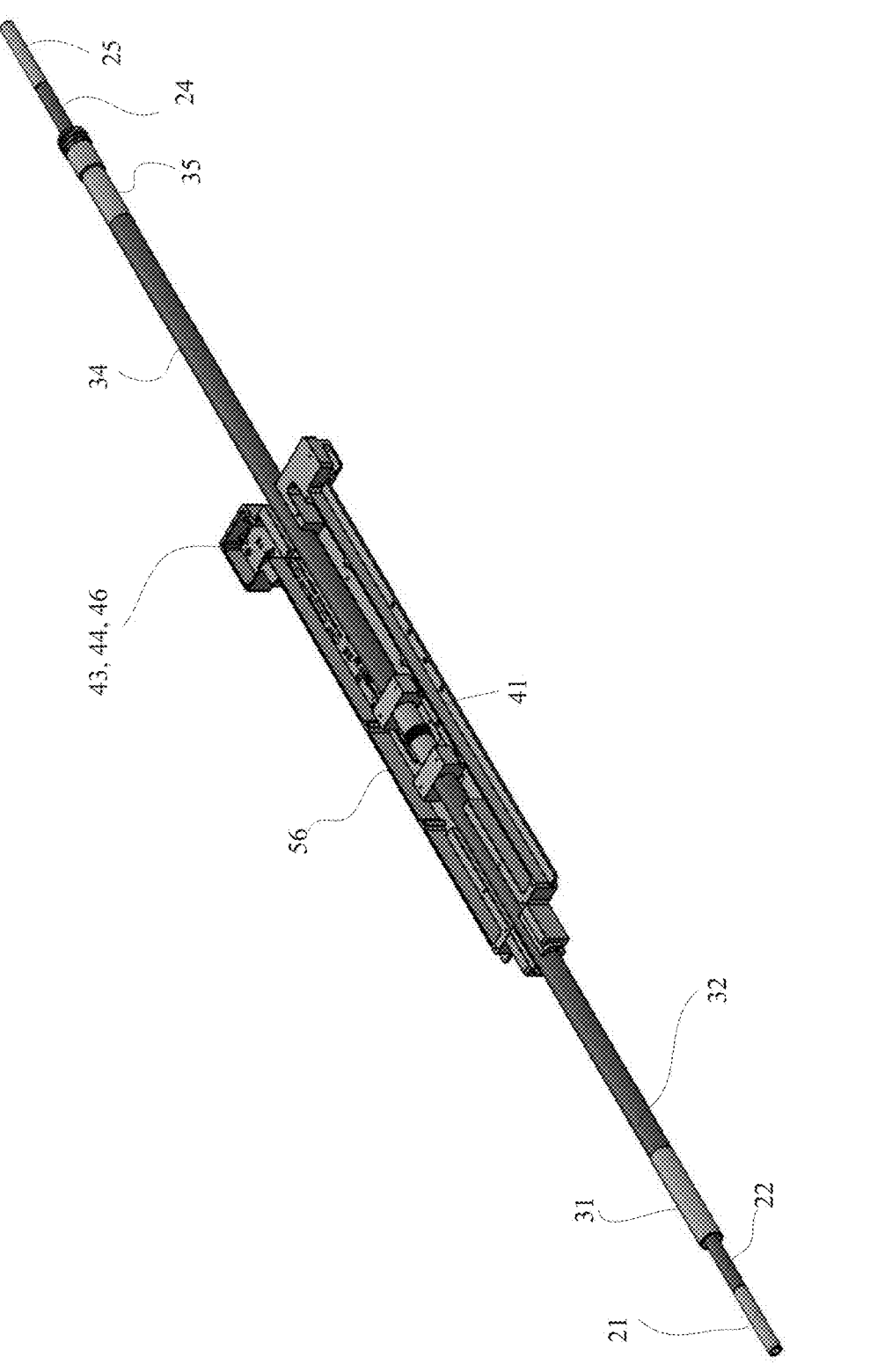
FIG. 1 illustrates an example of one or more components of an NMR device.
Figure 2:
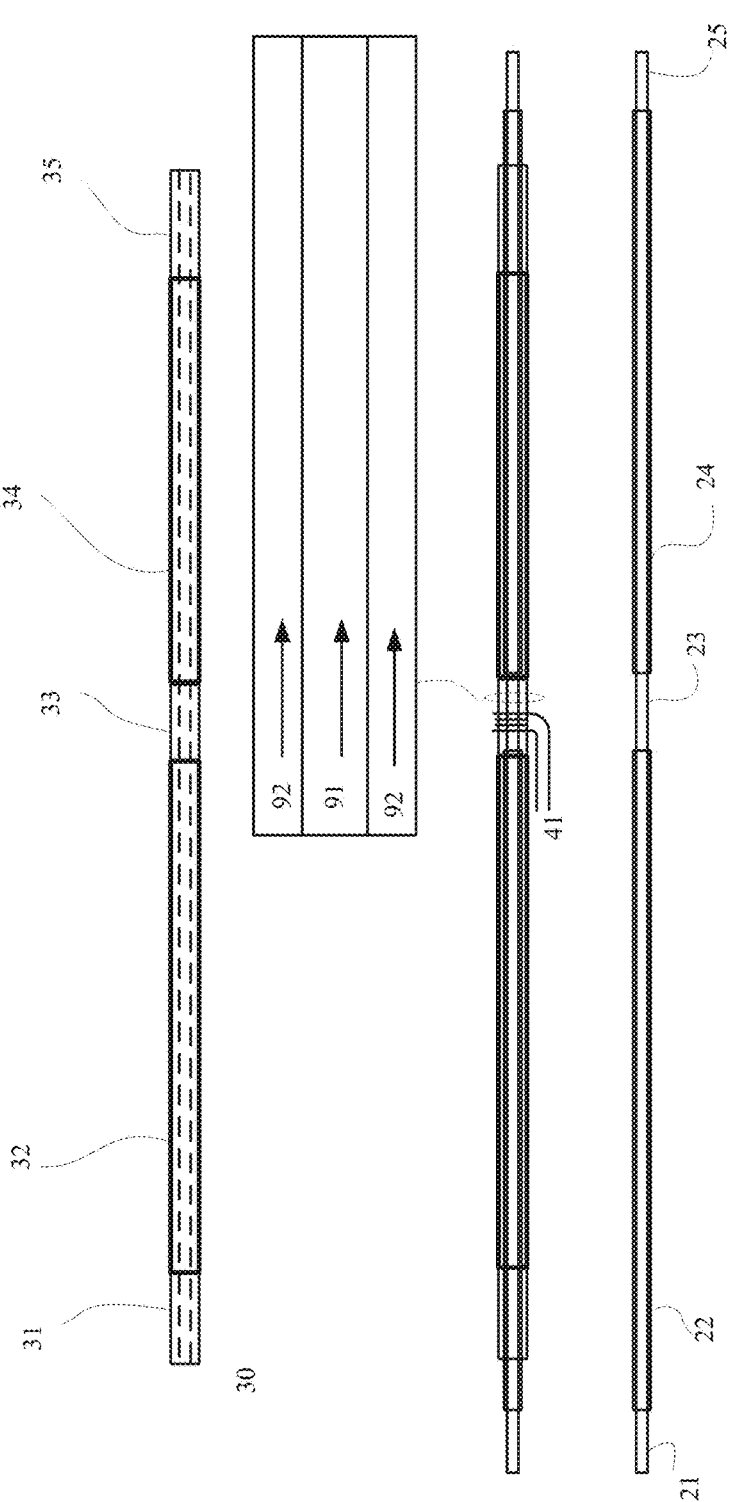
FIG. 2 illustrates an example of one or more components of an NMR device.
Figure 3:
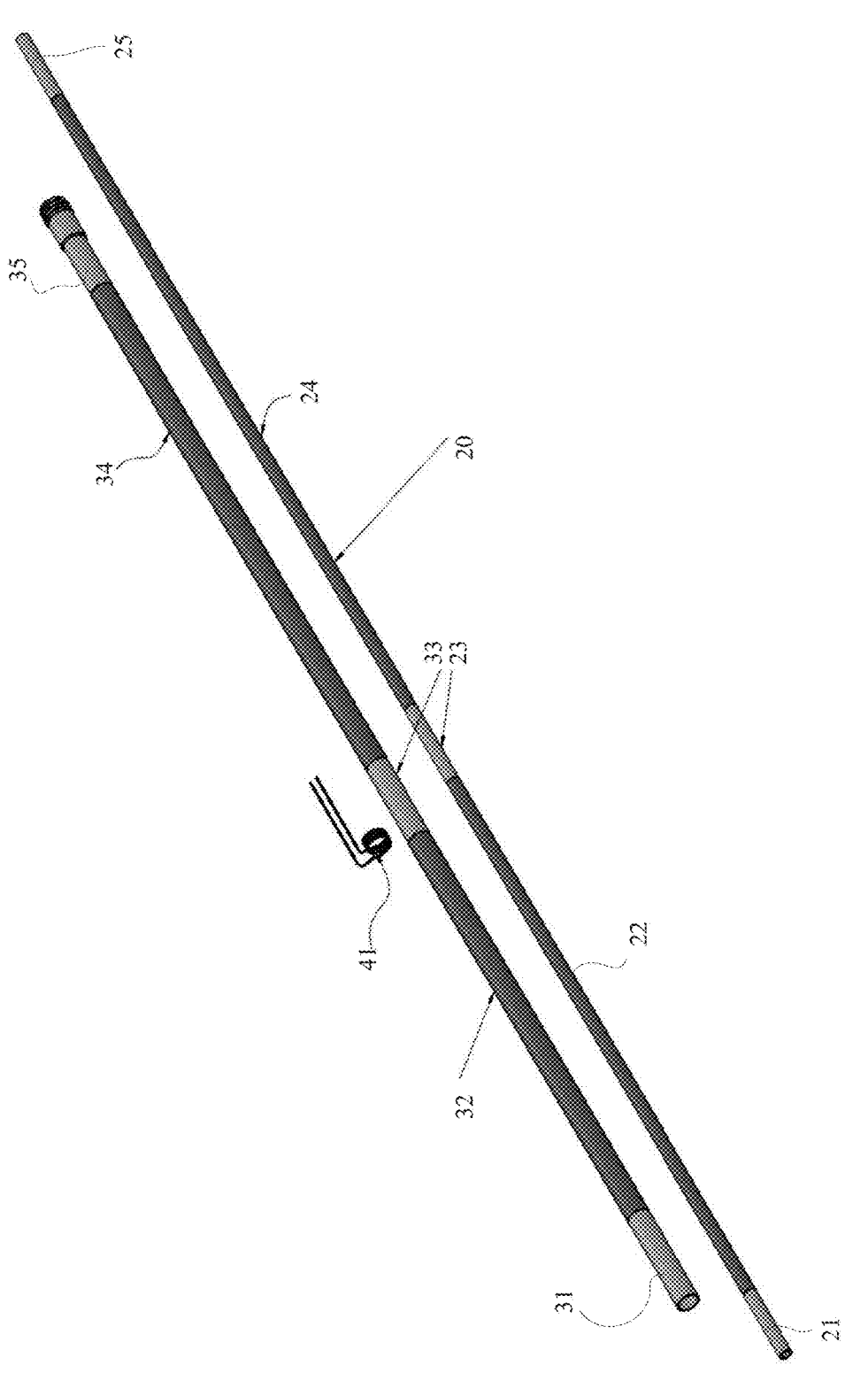
FIG. 3 illustrates an example of one or more components of an NMR device.
Figure 4:
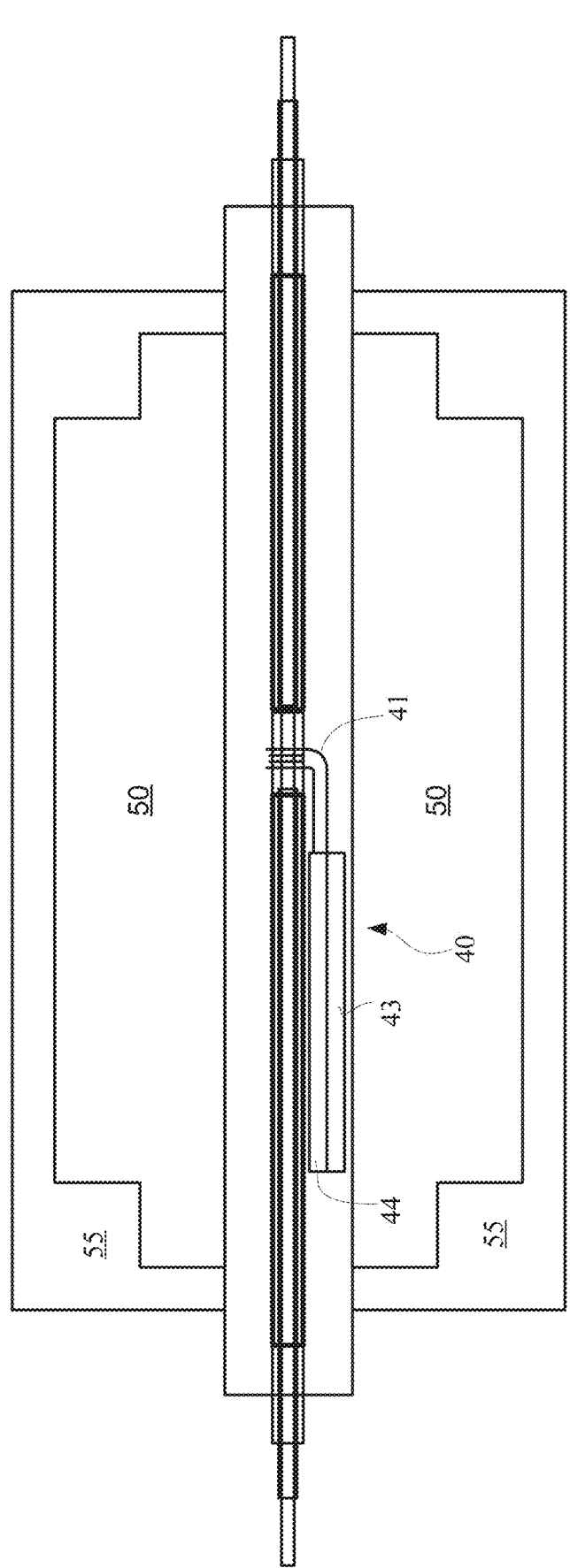
FIG. 4 illustrates an example of one or more components of an NMR device.
Figure 5:
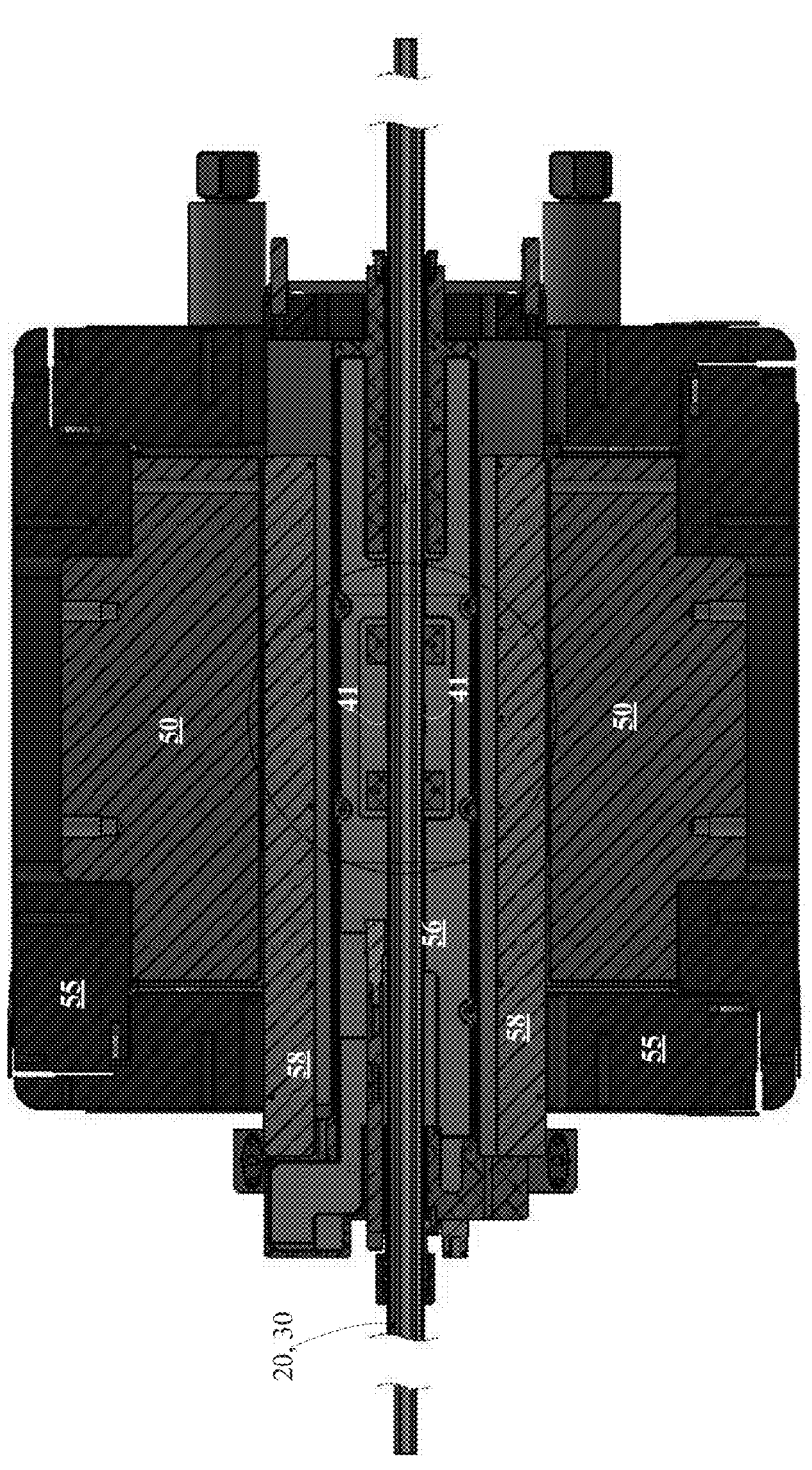
FIG. 5 illustrates an example of one or more components of an NMR device.
Figure 6:
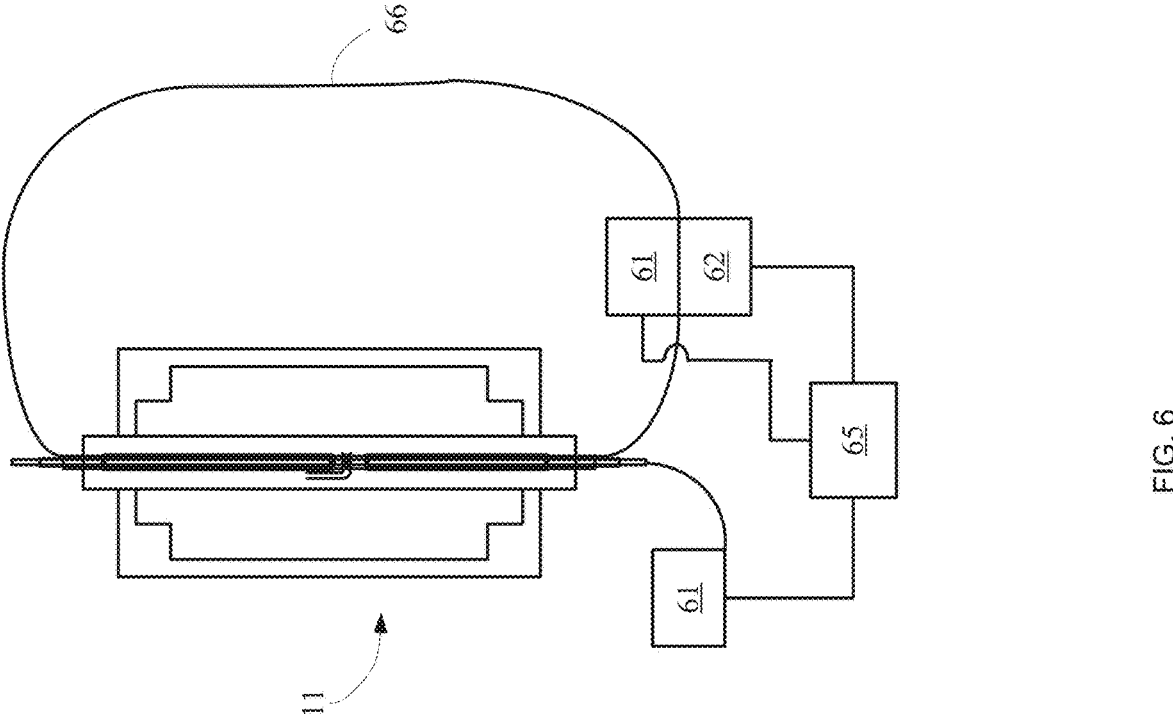
FIG. 6 illustrates an example of one or more components of an NMR device and its environment.
Figure 7:
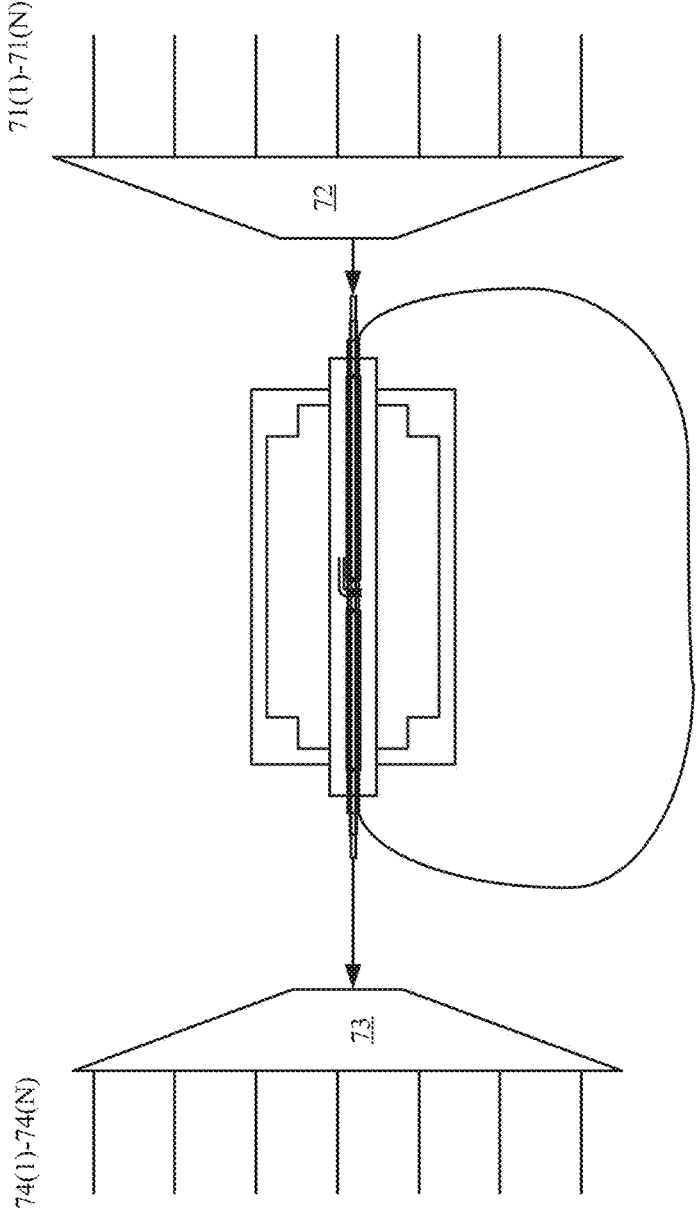
FIG. 7 is an example of one or more components of an NMR device and its environment.

According to an embodiment, the NMR device 11 includes (see FIGS. 1-5):

a. A first fluid conduit 20 that includes a measurement region 23 and is configured to convey a first fluid 91.

b. An NMR measurement unit 40 that is configured to perform an NMR measurement of the first fluid within the measurement region. The NMR measurement unit 40 includes permanent magnet 50.

c. A temperature control unit that is configured to thermally shield the permanent magnet, during the NMR measurement, from a temperature of the first fluid 91 within measurement region 23, wherein the temperature control unit includes a second fluid conduit 30 that is configured to convey a second fluid, the second fluid conduit 30 surrounds the first fluid conduit 20 and is made of a thermally insulating material.

According to an embodiment, the temperature control unit includes a temperature sensor 61 that is configured to measure a temperature of the second fluid and/or measure a temperature of the first fluid.

According to an embodiment, the temperature control unit includes a controller 65 is fed by temperature measurements of the second fluid and/or temperature measurements of the first fluid.

According to an embodiment, the temperature control unit includes a temperature setting unit 62 that is configured to set a temperature of the second fluid.

According to an embodiment, the temperature control unit does not include the temperature setting unit—but is in communication with the temperature setting unit—for example by sending instructions and/or requests to set the temperature of the second fluid.

According to an embodiment, the temperature setting unit is configured to set the temperature of the second fluid in order to set the temperature felt by the permanent magnet.

According to an embodiment, the temperature of the second fluid is set during the NMR measurement—but may also be set a defined period before the NMR measurement and/or after the NMR measurement.

According to an embodiment, the temperature of the second fluid is set so that during the NMR measurement the temperature felt by the permanent magnet does not exceed a defined temperature—for example does not exceed 55° C.—of another value that is lower than 55° C.

According to an embodiment, the temperature of the second fluid is set so that during the NMR measurement the temperature felt by the permanent magnet is constant.

According to an embodiment, during the NMR measurement, the temperature of the second fluid is sent to a value between a temperature of the first fluid and a maximal allowable temperature of the permanent magnet.

According to an embodiment, the first fluid 91 may freeze due to a failure associated with the flow of the first fluid and the temperature setting unit 62 may assist in evacuating the first fluid (during a fluid evacuation period) by increasing the temperature of the second fluid 92-even above a second fluid temperature than will cause the permanent magnet to feel a temperature that exceeds the maximal allowable temperature of the permanent magnet. During the fluid evacuation period the NMR device will not perform any NMR measurements- and the temperature increment will not impact the accuracy of the NMR measurements.

According to an embodiment, the first fluid conduit 20 includes a first measurement region segment 23 that surrounds the measurement region. The first measurement region segment is transparent to radiation emitted during the NMR measurement and is thermally insulating.

According to an embodiment, the second fluid conduit 30 includes a second measurement region segment 33 that surrounds the first measurement region segment. The second measurement region segment is transparent to radiation emitted during the NMR measurement and is thermally insulating.

According to an embodiment, heat may be radiated from the first fluid located outside the measurement region. In order to thermally shield the permanent magnet from the radiated heat-parts of the first fluid conduit and/or of the second fluid conduits may be thermally shielded.

According to an embodiment, the first fluid conduit 20 includes additional first segments 22 and 24 that are adjacent to the first measurement region segment, wherein the additional first segments are non-transparent to the radiation emitted during the NMR measurement and are thermally insulating. According to an embodiment, there are first transparent segments 21 and 25 beyond the additional first segments 22 and 24 as there are far enough from the measurement region.

According to an embodiment, the second fluid conduit further includes additional second segments 33 and 34 that are adjacent to the second measurement region segment, wherein the additional second segments are non-transparent to the radiation emitted during the NMR measurement and are thermally insulating. According to an embodiment, there are second transparent segments 31 and 35 beyond the additional first segments 32 and 34—as there are far enough from the measurement region.

According to an embodiment, the NMR measurement unit includes a probe 41, a transmission unit 43 and a reception unit 44. The probe is configured to receive a probing signal from the transmission unit, and to impact the magnetic field applied within the measurement region, and is also configured to sense a signal generated due to the transmission of the probing signal to provide a received signal to the reception unit.

According to an embodiment, the probe 41 includes a coil that is surrounded by the permanent magnet and surround the measurement region.

According to an embodiment, the NMR device is used for monitoring, in a time division multiplexing manner, fluid flows from different locations.

According to an embodiment, the NMR device further includes:

a. Multiple input conduits 71(1)-71(N) for receiving multiple fluid streams.

b. An input fluid selection unit 72 that is configured to select a selected input conduit and convey a fluid stream from the selected input conduit to the first fluid conduit to provide the first fluid.

c. An output fluid selection unit 73 that is configured to send the fluid stream to an output conduit (of output conduits 74(1)-74(N)). The output conduit may or may not correspond to the selected input conduit.

According to an embodiment the permanent magnet 50 is located within a first housing 55. According to an embodiment, the transmission unit 43 and a reception unit 44 and parts of the first and second fluid conduits are located within a structural element 56 that is located within a second housing 58.

FIG. 8 illustrates an example of method 100 for nuclear magnetic resonance (NMR) measurements.

According to an embodiment, method 100 includes step 110 of conveying a first fluid by a first fluid conduit that includes a measurement region.

According to an embodiment, method 100 includes step 120 of performing, by an NMR measurement unit, an NMR measurement of the first fluid within the measurement region. The NMR measurement unit includes a permanent magnet.

According to an embodiment, method 110 includes step 130 of thermally shielding, during the NMR measurement and by a temperature control unit, the permanent magnet from a temperature of the fluid within measurement region. The thermally shielding includes conveying a second fluid through a second fluid conduit, the second fluid conduit surrounds the first fluid conduit and is made of a thermally insulating material.

Steps 110 and 130 are executed in parallel to each other and step 120 may at least partially overlap steps 110 and 130—for example the conveying of the first fluid and the thermally isolation may be executed outside the NMR measurements.

According to an embodiment, method 100 includes step 140 of setting by a temperature setting unit, a temperature of the second fluid. The setting may be a part of step 130.

The setting may be executed during the execution of step 120 but may be executed before the execution of step 120 and/or after the completion of step 120.

According to an embodiment, step 140 includes setting the temperature of the second fluid, during the NMR measurement, to a value between a temperature of the first fluid and a maximal allowable temperature of the permanent magnet.

According to an embodiment, step 140 includes setting the temperature of the second fluid, during a fluid evacuation period, above the maximal allowable temperature of the permanent magnet.

According to an embodiment, method 100 includes step 150 of measuring a temperature of the second fluid and/or measuring the temperature of the first fluid. Step 150 may be included in step 130.

According to an embodiment, method 100 includes step 160 of receiving, by multiple input conduit, multiple fluid streams, step 170 of selecting, by an input fluid selection unit, a selected input conduit and convey a fluid stream from the selected input conduit to the first fluid conduit to provide the first fluid, and step 180 of sending, by an output fluid selection unit, the fluid stream to an output conduit—for example the output conduit that corresponds to the selected input conduit. An example of corresponding-belong to the same loop/fluidly coupled to, and the like.

In the foregoing detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using microelectronics and/or optical components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an."

The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A nuclear magnetic resonance (NMR) device, comprising:
   a first fluid conduit that comprises a measurement region and is configured to convey a first fluid;
   an NMR measurement unit that is configured to perform an NMR measurement of the first fluid within the measurement region; wherein the NMR measurement unit comprises a permanent magnet; and
   a temperature control unit that is configured to thermally shield the permanent magnet, during the NMR measurement, from a temperature of the first fluid within measurement region, wherein the temperature control unit comprises a second fluid conduit that is configured to convey a second fluid, the second fluid conduit surrounds the first fluid conduit and is made of a thermally insulating material.

2. The NMR device according to claim 1, wherein the temperature control unit comprises a temperature sensor that is configured to measure a temperature of the second fluid.

3. The NMR device according to claim 1, wherein the temperature control unit comprises a temperature setting unit that is configured to set a temperature of the second fluid.

4. The NMR device according to claim 3, wherein the temperature setting unit that is configured to set the temperature of the second fluid, during the NMR measurement, to a value between a temperature of the first fluid and a maximal allowable temperature of the permanent magnet.

5. The NMR device according to claim 4, wherein the temperature setting unit that is configured to set the temperature of the second fluid, during a fluid evacuation period, above the maximal allowable temperature of the permanent magnet.

6. The NMR device according to claim 1, wherein the first fluid conduit comprises a first measurement region segment that surrounds the measurement region, wherein the first measurement region segment is transparent to radiation emitted during the NMR measurement and is thermally insulating.

7. The NMR device according to claim 6, wherein the first fluid conduit further comprises additional first segments that are adjacent to the first measurement region segment, wherein the additional first segments are non-transparent to the radiation emitted during the NMR measurement and are thermally insulating.

8. The NMR device according to claim 6, wherein the second fluid conduit comprises a second measurement region segment that surrounds the first measurement region segment, wherein the second measurement region segment is transparent to radiation emitted during the NMR measurement and is thermally insulating.

7

8

9. The NMR device according to claim 8, wherein the second fluid conduit further comprises additional second segments that are adjacent to the second measurement region segment, wherein the additional second segments are non-transparent to the radiation emitted during the NMR measurement and are thermally insulating.

10. The NMR device according to claim 1, wherein the NMR measurement unit comprises a coil that is surrounded by the permanent magnet and surround the measurement region.

11. The NMR device according to claim 1, wherein the temperature control unit comprises a temperature sensor that is configured to measure a temperature of the first fluid.

12. The NMR device according to claim 1, further comprising:

multiple input conduits for receiving multiple fluid streams;

an input fluid selection unit that is configured to select a selected input conduit and convey a fluid stream from the selected input conduit to the first fluid conduit to provide the first fluid; and an output fluid selection unit that is configured to send the fluid stream to an output conduit that corresponds to the selected input conduit.

13. A method for nuclear magnetic resonance (NMR) measurements, the method comprising:

conveying a first fluid by a first fluid conduit that comprises a measurement region;

performing, by an NMR measurement unit, an NMR measurement of the first fluid within the measurement region; wherein the NMR measurement unit comprises a permanent magnet; and thermally shielding, during the NMR measurement and by a temperature control unit, the permanent magnet from a temperature of the fluid within measurement region, wherein the thermally shielding comprises conveying a second fluid through a second fluid conduit, the second fluid conduit surrounds the first fluid conduit and is made of a thermally insulating material.

14. The method according to claim 13, comprising setting, by a temperature setting unit, a temperature of the second fluid.

15. The method according to claim 14, comprising setting the temperature of the second fluid, during the NMR measurement, to a value between a temperature of the first fluid and a maximal allowable temperature of the permanent magnet.

16. The method according to claim 15, comprising setting the temperature of the second fluid, during a fluid evacuation period, above the maximal allowable temperature of the permanent magnet.

17. The method according to claim 13, comprising measuring a temperature of the second fluid.

18. The method according to claim 13, comprising measuring a temperature of the first fluid.

19. The method according to claim 13, comprising:

receiving, by multiple input conduit, multiple fluid streams;

selecting, by an input fluid selection unit, a selected input conduit and convey a fluid stream from the selected input conduit to the first fluid conduit to provide the first fluid; and sending, by an output fluid selection unit, the fluid stream to an output conduit that corresponds to the selected input conduit.

* * * * *